(12) United States Patent
Jakoby et al.

(10) Patent No.: US 11,293,967 B2
(45) Date of Patent: Apr. 5, 2022

(54) CONDUCTIVITY SENSOR AND METHOD FOR PRODUCING A CONDUCTIVITY SENSOR

(71) Applicant: KROHNE Messtechnik GmbH, Duisburg (DE)

(72) Inventors: Mark Jakoby, Bottrop (DE); Christoph Bönneken, Dinslaken (DE)

(73) Assignee: KROHNE MESSTECHNIKGMBH, Duisburg (DE)

( * ) Notice: Subject to any disclaimer, the term of this patent is extended or adjusted under 35 U.S.C. 154(b) by 217 days.

(21) Appl. No.: 16/655,312

(22) Filed: Oct. 17, 2019

(65) Prior Publication Data

US 2020/0124660 A1   Apr. 23, 2020

(30) Foreign Application Priority Data

Oct. 17, 2018 (DE) .................... 10 2018 125 789.9

(51) Int. Cl.
| | |
|---|---|
| *G01R 31/28* | (2006.01) |
| *G01R 27/26* | (2006.01) |
| *G01N 27/327* | (2006.01) |
| *G01D 5/24* | (2006.01) |

(52) U.S. Cl.
CPC ..... *G01R 31/2812* (2013.01); *G01N 27/3272* (2013.01); *G01R 27/2605* (2013.01); *G01D 5/24* (2013.01)

(58) Field of Classification Search
CPC .... G01R 31/00; G01R 31/28; G01R 31/2801; G01R 31/281; G01R 31/2812; G01R 27/00; G01R 27/02; G01R 27/26; G01R 27/2605; G01R 1/00; G01R 1/02; G01R 1/04; G01R 1/0408; G01N 27/00; G01N 27/02; G01N 27/04; G01N 27/06; G01N 27/07; G01N 27/26; G01N 27/28; G01N 27/30; G01N 27/327; G01N 27/3271; G01N 27/3272; G01D 5/00; G01D 5/12; G01D 5/14; G01D 5/24
USPC ........ 324/600, 649, 658, 686; 702/1, 47, 52, 702/53, 57
See application file for complete search history.

(56) References Cited

U.S. PATENT DOCUMENTS

| | | |
|---|---|---|
| 4,118,663 A | 10/1978 | Barben, II |
| 4,227,151 A | 10/1980 | Ellis et al. |
| 6,369,579 B1 | 4/2002 | Riegel |
| 9,500,735 B2 | 11/2016 | Riegel |

(Continued)

*Primary Examiner* — Hoai-An D. Nguyen
(74) *Attorney, Agent, or Firm* — David S. Safran; Roberts Calderon Safran & Cole, P.C.

(57) ABSTRACT

A conductivity sensor having a sensor housing and a sensor element, the sensor element having at least a first electrode and a second electrode, the first electrode is impinged during operation by a current or voltage signal via a first feed line, the second electrode is impinged during operation by a current or voltage signal via a second feed line, and the first feed line and/or the second feed line is/are arranged in the sensor housing, and the conductivity sensor has a longitudinal axis. To provide a conductivity sensor which has a particularly high measuring range is achieved in that at least one fixing element is provided, the at least one fixing element being arranged inside the sensor housing and in that the first feed line and/or the second feed line is/are fixed in their position by the at least one fixing element.

13 Claims, 5 Drawing Sheets

(56) References Cited

U.S. PATENT DOCUMENTS

| | | | |
|---|---|---|---|
| 2008/0297173 A1 | 12/2008 | Zhou et al. | |
| 2010/0230283 A1 | 9/2010 | Fanselow et al. | |
| 2011/0304564 A1* | 12/2011 | Kim | G06F 3/044 345/173 |
| 2012/0182259 A1* | 7/2012 | Han | G06F 3/0418 345/174 |
| 2014/0354572 A1* | 12/2014 | Zhao | G06F 3/0412 345/173 |
| 2016/0062502 A1* | 3/2016 | Liu | G06F 3/0412 345/174 |
| 2018/0188615 A1* | 7/2018 | Li | G09G 3/3648 |
| 2018/0307337 A1* | 10/2018 | Ahn | G06F 3/044 |
| 2019/0147211 A1* | 5/2019 | Shu | G06K 9/0002 382/124 |
| 2019/0346387 A1* | 11/2019 | Kosub | G01N 27/041 |

* cited by examiner

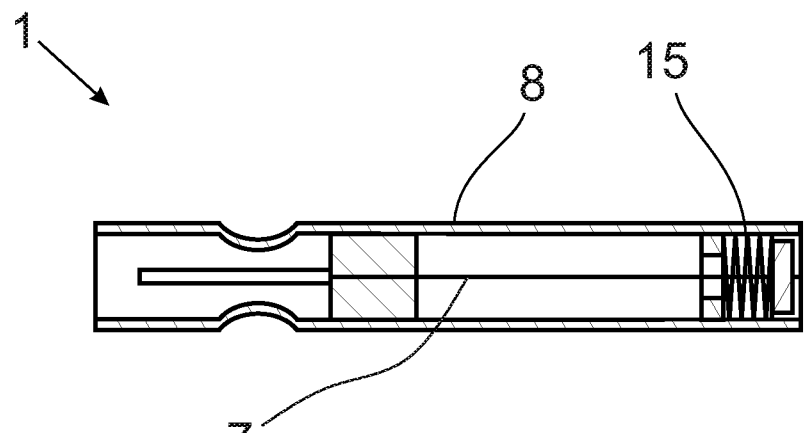
Fig. 4
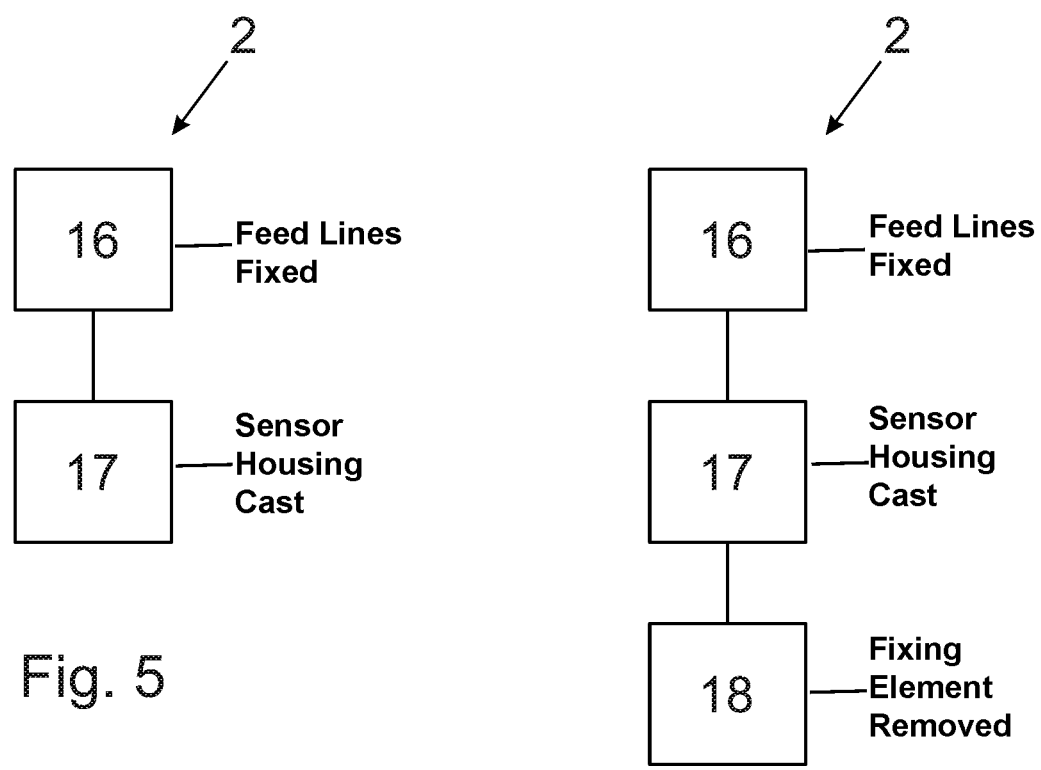
Fig. 5
Fig. 6

CONDUCTIVITY SENSOR AND METHOD FOR PRODUCING A CONDUCTIVITY SENSOR

BACKGROUND OF THE INVENTION

Field of the Invention

The invention is based on a conductivity sensor having a sensor housing and a sensor element, wherein the sensor element has at least a first electrode and a second electrode, wherein the first electrode is impinged during operation by a current or voltage signal via a first feed line, wherein the second electrode is impinged during operation by a current or voltage signal via a second feed line, wherein the first feed line and/or the second feed line is/are arranged in the sensor housing and wherein the conductivity sensor has a longitudinal axis.

Furthermore, the invention relates to a method for producing a conductivity sensor, wherein the conductivity sensor has a sensor housing and a sensor element, wherein the sensor element has at least a first electrode and a second electrode, wherein the first electrode is impinged by a current or voltage signal during operation via a first feed line, wherein the second electrode is impinged by a current or voltage signal during operation via a second feed line, and wherein the first feed line and/or the second feed line is/are arranged in the sensor housing.

Conductive conductivity sensors having a sensor element consisting of at least two electrodes arranged parallel or coaxial to one another are known from the state of the art. The invention deals, in particular, with the geometric minimization of such conductivity sensors. Preferably, the conductivity sensor according to the invention is designed in such a manner that the ratio of the diameter of the sensor housing to the length of the sensor housing is approximately 1:2 or more. In addition, according to one design, the diameter of the sensor housing is a maximum of 15 mm. Particularly under these circumstances, disturbing side effects gain increasing influence. However, the invention is not limited to the dimensions mentioned above and the design of a conductivity sensor according to the invention is also advantageous in the case of deviating dimensions.

According to a further design, the conductivity sensor according to the invention is dimensioned in such a manner that it can be connected to already existing process terminals of a measuring system for pH sensors. This has the advantage that existing process terminals can be optimally used.

Description of Related Art

It is known from German Patent Application DE 198 44 489 A1 and corresponding U.S. Pat. No. 6,369,579 B1 that the inner electrode is centered in a coaxial arrangement of the two electrodes, whereby a calibration of the conductivity sensor can be avoided. The centering of the inner electrode is achieved by using a mounting means, which is removed again after the inner electrode has been mounted.

Based on this state of the art, it is the object of this invention to provide a conductivity sensor with a particularly high measuring range. In addition, it is the object of the invention to provide a method for producing such a conductivity sensor.

SUMMARY OF THE INVENTION

According to a first teaching of the present invention, the above-mentioned object is achieved by a conductivity sensor described in the introduction in that at least one fixing element is present, wherein the at least one fixing element is arranged inside the sensor housing and that the first feed line and/or the second feed line is/are fixed in their position by the at least one fixing element.

It has been recognized that by using a fixing element, the first feed line and/or the second feed line can be fixed both temporally and spatially inside the sensor housing. The fixing element is designed in such a manner that a spatial fixing is defined, i.e. repeatable. This has the advantage that the use of the fixing element with a plurality of conductivity sensors leads to the capacitance formed between at least the first and the second feed line always assuming essentially the same value and, in this respect, can be taken into account as a predictable, defined value in the measurement process.

Furthermore, according to the invention, the first feed line and the second feed line are fixed in their position in such a manner that a temporal change in the position of the first and/or second feed line can also be avoided in the event of vibrations of the conductivity sensor, for example. In this respect, there is no advantageous microphonic effect in the conductivity sensor according to the invention.

As a result, scattering of the measured values can be reduced by the previously described defined routing of the feed lines and by taking into account a defined capacitance, thus improving the measuring accuracy and increasing the measuring range of the conductivity sensor.

According to one design, at least one fixing element is designed as a shaped piece. Such a shaped piece, for example, is designed as a centering spider with spacers to the sensor housing. It is particularly preferred that the shaped piece be made of plastic, for example, in an injection molding process. According to the next design, there are several fixing elements that are arranged one behind the other within the sensor housing in the direction of the longitudinal axis of the conductivity sensor.

According to a further design, at least one fixing element is designed as a spring element, preferably a tension spring or a compression spring, wherein the spring element fixes the first and/or the second feed line preferably permanently under mechanical tension.

In addition, it is also advantageous when the fixing element of the first feed line and/or the second feed line is designed as a casting compound, such as epoxy resin, for example.

According to another particularly preferred design, the first feed line and the second feed line are arranged by the fixing element in such a manner that they have a maximum distance from one another along the longitudinal axis, wherein the maximum distance is limited in particular by the geometric structure of the conductivity sensor.

This design has the advantage that the formation of the parasitic capacitance can be minimized and thus the quality of the measured values can be improved. The maximum distance of the first feed line to the second feed line along the longitudinal axis is defined or limited in particular by the geometric structure of the conductivity sensor. In this respect, the sensor housing acts as an outer limitation of the maximum distance between the two feed lines. In addition, installations projecting into the sensor housing must also be taken into account.

It is also advantageous when the first feed line and the second feed line run essentially parallel to one another along the longitudinal axis. If the first feed line and the second feed line are both arranged inside the sensor housing, it is advantageous when the two feed lines are preferably diametrically opposed to one another inside the sensor housing.

It is also advantageous when the first and second feed lines run almost parallel, wherein the distance between the first feed line and the second feed line varies by less than 10% of the distance.

According to a further design, the second feed line is designed at least as part of the sensor housing in such a manner that the second feed line coaxially surrounds the first feed line. In this manner it is ensured that the first feed line is arranged at a maximum distance from the second feed line and that the first feed line is advantageously fixed in such a manner that the distance between the two feed lines in the direction of the longitudinal axis of the conductivity sensor is constant. In this case, the distance between the first feed line and the second feed line is half the diameter of the sensor housing or the second feed line. The second feed line can be designed as part of the sensor housing or as a complete sensor housing.

According to a next configuration, the sensor element has at least a third electrode and a fourth electrode, wherein the third electrode is connected to a third feed line and the fourth electrode is connected to a fourth feed line, and wherein the four feed lines are fixed in their position defined both temporally and spatially by the at least one fixing element according to the invention.

According to a next design, the sensor element has at least a third electrode and a fourth electrode, wherein the third electrode is connected to a third feed line and the fourth electrode is connected to a fourth feed line, and wherein the third and fourth feed lines have a maximum distance from one another, wherein the maximum distance is limited, in particular, by the geometric structure of the conductivity sensor, and wherein the third feed line and the fourth feed line are fixed in their position. Preferably, the third feed line and the fourth feed line are fixed by means of the same fixing element as the first feed line and/or the second feed line. In addition, it is also conceivable that the third and fourth feed lines are fixed separately by a further fixing element.

According to a preferred design, the first and second feed lines inside the sensor housing are arranged opposite one another, preferably diametrically, and the third and fourth feed lines inside the sensor housing are arranged opposite one another, preferably diametrically.

The four feed lines are particularly preferably arranged such that the first plane spanned by the first and second feed lines forms an angle α with the second plane spanned by the third and fourth feed lines, wherein the angle α is between 0 and 180° and wherein the angle α is particularly preferably approximately 90°. If the angle α is approximately 90°, crosstalk between the feed lines can be minimized.

As already explained above, the form factor of the conductivity sensor is decisive in the context of the present invention, since accompanying phenomena such as parasitic capacities of the feed lines play a role, especially in the dimensions described in the introduction.

According to one design, the conductivity sensor has a diameter of 12 mm and a process terminal with a PG 13.5 thread.

According to a further design, the length of the conductivity sensor is 120 mm or 225 mm.

According to a second teaching of the present invention, the object described above is achieved by a method mentioned in the introduction in that a fixing element is provided and that at least the first feed line and/or the second feed line is/are inserted into the fixing element during installation in such a manner that it/they is/are fixed in its/their position inside the sensor housing by the fixing element.

According to one design of the method, the first feed line and the second feed line are fixed along the longitudinal axis in such a manner that they are at a maximum distance from one another, wherein the maximum distance is limited, in particular, by the geometric structure of the conductivity sensor.

The interior of the sensor housing is cast according to one implementation of the method, wherein, during casting, the fixing element fixes at least the first and/or the second feed line in its/their position, preferably under mechanical stress, wherein the fixing element is cast in or is removed again after casting and hardening of the casting compound.

If the fixing element is removed again after the casting and hardening of the casting compound, the casting compound can also form a fixing element of the conductivity sensor.

Furthermore, it is also advantageous when the conductivity sensor is designed according to one of the designs described above.

In detail, there are now a number of possibilities for designing and further developing the conductivity sensor and the method according to the invention. For this, reference is made both to the patent claims subordinate to the independent patent claims and to the following description of preferred embodiments with reference to the accompanying drawings.

BRIEF DESCRIPTION OF THE DRAWINGS

FIG. 4 is another embodiment of a conductivity sensor according to the invention;
FIG. 5 is a first embodiment of a method according to the invention;
FIG. 6 is second embodiment of a method according to the invention.

DETAILED DESCRIPTION OF THE INVENTION

Figure 1:
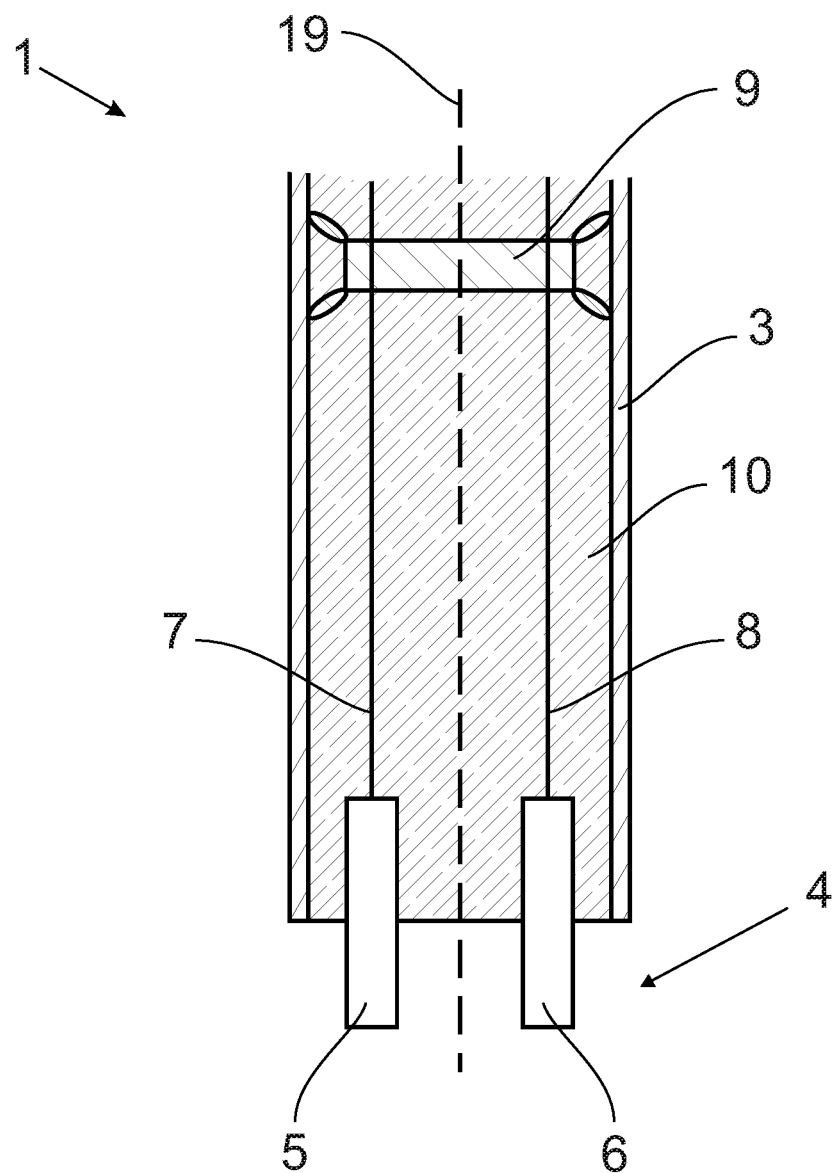
FIG. 1 is a first embodiment of a conductivity sensor.

FIG. 1 shows a conductivity sensor 1 with a sensor housing 3 and a sensor element 4, wherein the sensor element 4 has a first electrode 5 and a second electrode 6, wherein the two electrodes 5, 6 are arranged parallel to one another, and wherein the first electrode 5 is connected to a first feed line 7 and the second electrode 6 is connected to a second feed line 8. The first feed line 7 and the second feed line 8 run essentially parallel to one another along the longitudinal axis 19 inside the sensor housing 3 and, in particular, have a maximum distance from one another. The feed lines 7, 8 are fixed in their position by a fixing element 9 in the form of a centering spider, wherein the defined guiding of the feed lines 7 and 8 is additionally stabilized by means of a casting compound 10. The illustrated conductivity sensor 1 has the advantage that, due to the combination of the fixing elements 9, in detail the centering spider and the casting compound 10, the capacitance formed between the feed lines 7 and 8 has a defined, i.e. predictable value which can be taken into account during measurement or evaluation, so that the measurement accuracy of the illustrated conductivity sensor 1 can be increased as a result and the measurement range extended.

Figure 2:
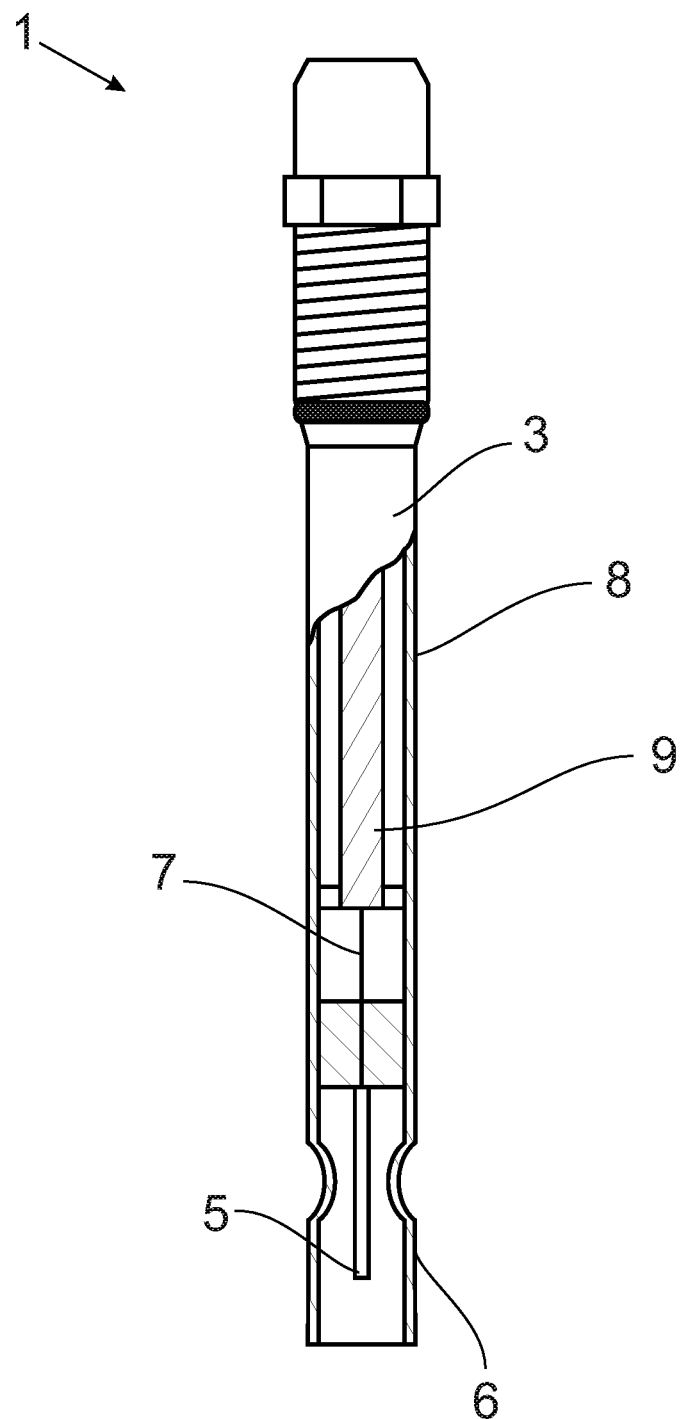
FIG. 2 is a second embodiment of an invented conductivity sensor.

FIG. 2 shows another example of a conductivity sensor 1, where both the first electrode 5 and the second electrode 6 as well as the first feed line 7 and the second feed line 8 are arranged coaxial to one another. In this embodiment, the second feed line 8 is designed as part of sensor housing 3. The first feed line 7 is fixed concentrically to the second feed line 8 by a fixing element 9, which is designed as a centering spider in the embodiment shown. This ensures, on the one hand, that the first feed line 7 and the second feed line 8 are at a maximum distance from one another and that, on the other hand, the distance between the first feed line 7 and the second feed line 8 does not vary along the longitudinal axis of the conductivity sensor 1.

Figure 3A:
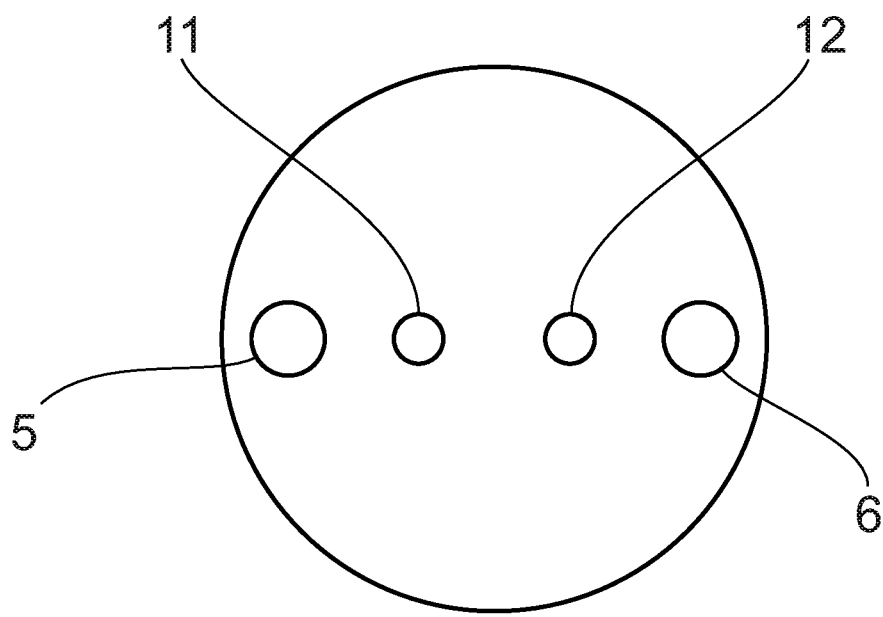
FIGS. 3a and 3b are an arrangement according to the invention of feed lines of a conductivity sensor.
Figure 3B:
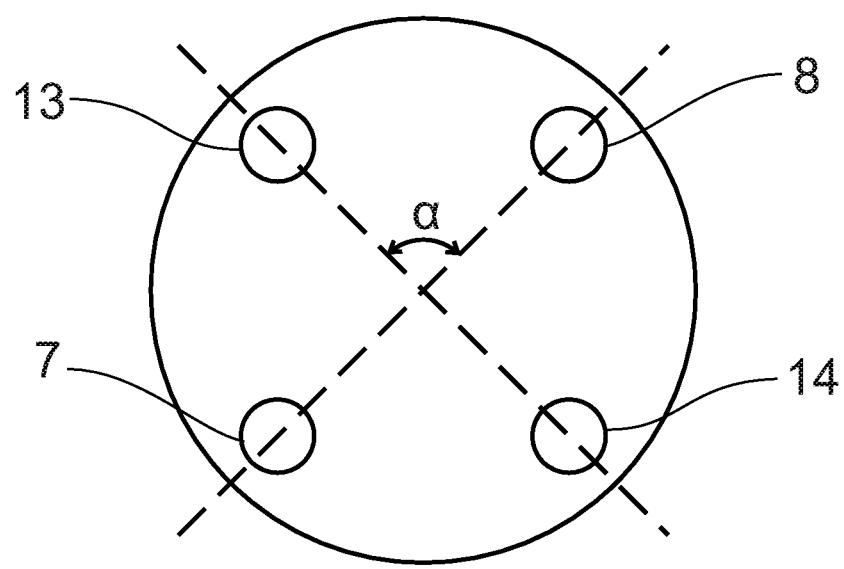

FIG. 3a shows a plan view of a sensor element 4, wherein, in addition to the first electrode 5 and the second electrode 6, a third electrode 11 and a fourth electrode 12 are provided, which are arranged between the first two electrodes 5 and 6 in order to measure the voltage formed within the medium. FIG. 3b shows a cross-section of the conductivity sensor 1 in the region of the sensor housing 3 with the feed lines 7, 8 of the first two electrodes 5, 6 and the feed line 13 of the electrode 11 and the feed line 14 of the electrode 12. The feed lines 7, 8, 13 and 14 in the illustrated embodiment are arranged in such a manner that the plane spanned by the first and the second feed line 7, 8 is arranged perpendicular to the plane spanned by the third and the fourth feed line 13, 14. This design ensures that the feed lines 7, 8, 13 and 14 have a maximum and constant distance along the longitudinal axis 19 of the conductivity sensor 1, whereby the scattering of the measured values can be significantly reduced as a result.

FIG. 4 shows a further embodiment of a conductivity sensor 1 according to the invention, wherein the first feed line 7 and the second feed line 8 are arranged coaxially to one another, and wherein the first feed line 5 is fixed in its position concentrically to the second feed line 8 by a compression spring 15. Only the essential part of the conductivity sensor 1 is shown in the illustrated embodiment, in detail FIG. 4 does not show the connection of the first feed line 7 and the second feed line 8.

In FIG. 5, a first embodiment is illustrated of a method 2 for producing a conductivity sensor 1, wherein the conductivity sensor 1 has a sensor housing 3 and a sensor element 4, wherein the sensor element 3 has a first electrode 5 and a second electrode 6, wherein the first electrode 5 is impinged during operation by a current or voltage signal via a first feed line 7, wherein the second electrode 6 is impinged during operation by a current or voltage signal via a second feed line 8, and wherein the first feed line 7 and/or the second feed line 8 is/are arranged in the sensor housing 3. In a first step of the method 2, the first feed line 5 and the second feed line 6 are arranged in such a manner and fixed 16 in their position in a defined manner according to the invention, wherein at the same time they are at a maximum distance from one another. This fixation 16 takes place via a fixing element 9 in the form of a shaped piece. In a next step 17, the inside of the sensor housing 3 is cast, wherein the fixing element 9 is also cast at the same time and thus remains in the conductivity sensor 1.

In an alternative method 2 shown in FIG. 6, the fixing element 9 is designed and arranged in such a manner that it is removed 18 again after casting 17 and after the casting has hardened.

Figure 7:
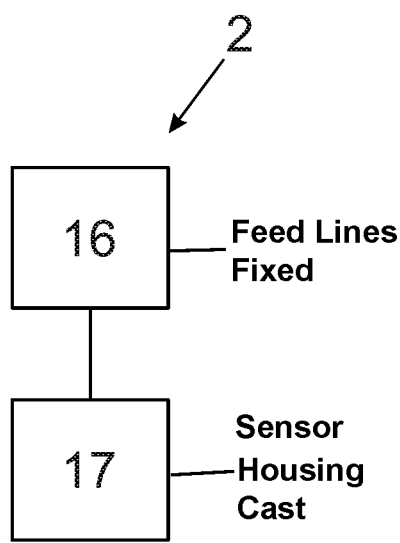
FIG. 7 is third embodiment of a method according to the invention.

In the method 2 shown in FIG. 7, the first and/or the second feed line is/are fixed 16 by a fixing element 9 in the form of a spring element under mechanical tensile stress. In a next step 17, the interior of the sensor housing 3 is cast, wherein the spring element remains in the sensor housing after casting.

Figure 8:
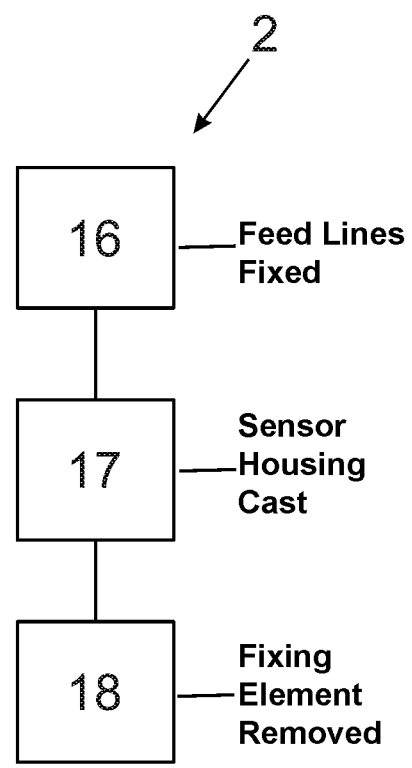
FIG. 8 is a fourth embodiment of a method according to the invention.

In the method 2 shown in FIG. 8, the first and/or the second feed line are also fixed 16 by a spring element under mechanical tensile stress, wherein the spring element is removed 18 again after casting 17 and after the casting has hardened.

What is claimed is:

1. A conductivity sensor comprising:
   a tubular sensor housing,
   a first feed line,
   a second feed line, and
   a sensor element, wherein the sensor element has at least a first electrode and a second electrode, wherein the first electrode is impinged during operation by a current or voltage signal via the first feed line, wherein the second electrode is impinged during operation by a current or voltage signal via the second feed line, and wherein the first feed line or the second feed line is arranged in the tubular sensor housing, and wherein the conductivity sensor has a longitudinal axis, wherein at least one fixing element is provided,
   wherein the at least one fixing element is arranged inside the tubular sensor housing, and
   wherein the first feed line or the second feed line is fixed in a position within the tubular sensor housing by the at least one fixing element.

2. The conductivity sensor according to claim 1, wherein the at least one fixing element is configured as a shaped piece.

3. The conductivity sensor according to claim 1, wherein the at least one fixing element is configured as a spring element including a tension spring or a compression spring, wherein the spring element fixes the first feed line or the second feed line under a mechanical stress.

4. Conductivity sensor according to claim 1, wherein the at least one fixing element of the first feed line or the second feed line is configured as a casting compound.

5. The conductivity sensor according to claim 1, wherein the first feed line and the second feed line are arranged by the fixing element to have a maximum distance from one another along the longitudinal axis, wherein the maximum distance is limited by a geometric structure of the conductivity sensor.

6. The conductivity sensor according to claim 1, wherein the second feed line is configured at least as part of the sensor housing which coaxially surrounds the first feed line.

7. The conductivity sensor according to claim 1, wherein the sensor element has at least a third electrode and a fourth electrode, wherein the third electrode is connected to a third feed line and the fourth electrode is connected to a fourth feed line, and wherein the third feed line and the fourth feed line are at a maximum distance from one another, wherein the maximum distance is limited by a geometric structure of the conductivity sensor, and wherein the third feed line and the fourth feed line are fixed in position.

8. The conductivity sensor according to claim 7, wherein a first plane, which is spanned by the first and the second feed line, forms an angle $\alpha$ with a second plane, which is spanned by the third and the fourth feed line, wherein the angle $\alpha$ is approximately 90°.

9. The conductivity sensor according to claim 1, wherein the conductivity sensor has a diameter of 12 mm and a process terminal with a thread.

10. The conductivity sensor according to claim 1, wherein the length of the conductivity sensor is 120 mm or 225 mm.

11. A method for producing a conductivity sensor, comprising:
providing a tubular sensor housing and a sensor element having at least a first electrode and a second electrode, wherein the first electrode is able to be impinged by a current or voltage signal via a first feed line, and the second electrode being able to be impinged during operation by a current or voltage signal via a second feed line,
arranging the first feed line or the second feed line in the tubular sensor housing, and
wherein the conductivity sensor has a longitudinal axis, and a fixing element, comprising inserting at least the first feed line or the second feed line into the fixing element during assembly so as to be fixed in position within the tubular sensor housing by the fixing element.

12. The method for producing a conductivity sensor according to claim 11, wherein the first feed line or the second feed line is fixed along the longitudinal axis to have a maximum distance from one another, wherein the maximum distance is limited by a geometric structure of the conductivity sensor.

13. The method for producing a conductivity sensor according to claim 11, further comprising casting an interior of the sensor housing, wherein, during casting, the fixing element fixes at least the first or the second feed line in position under a mechanical stress, wherein the fixing element is cast in or is removed again after casting and hardening of a casting compound.

* * * * *